(12) United States Patent
Iseki et al.

(10) Patent No.: US 11,565,238 B2
(45) Date of Patent: Jan. 31, 2023

(54) ADSORPTIVE TEMPORARY FIXING SHEET AND METHOD FOR MANUFACTURING SAME

(71) Applicant: NITTO DENKO CORPORATION, Ibaraki (JP)

(72) Inventors: Toru Iseki, Ibaraki (JP); Kohei Doi, Ibaraki (JP); Mitsuhiro Kanada, Ibaraki (JP); Kazumichi Kato, Ibaraki (JP); Hideyuki Tokuyama, Ibaraki (JP)

(73) Assignee: NITTO DENKO CORPORATION, Ibaraki (JP)

( * ) Notice: Subject to any disclaimer, the term of this patent is extended or adjusted under 35 U.S.C. 154(b) by 560 days.

(21) Appl. No.: 16/603,388

(22) PCT Filed: Jan. 22, 2018

(86) PCT No.: PCT/JP2018/001754
§ 371 (c)(1),
(2) Date: Oct. 7, 2019

(87) PCT Pub. No.: WO2018/185998
PCT Pub. Date: Oct. 11, 2018

(65) Prior Publication Data
US 2020/0030772 A1   Jan. 30, 2020

(30) Foreign Application Priority Data

Apr. 5, 2017  (JP) .............................. JP2017-075475

(51) Int. Cl.
| | |
|---|---|
| *B01J 20/26* | (2006.01) |
| *C09J 7/10* | (2018.01) |
| *B01J 20/28* | (2006.01) |
| *B01J 20/30* | (2006.01) |
| *H01L 21/683* | (2006.01) |

(52) U.S. Cl.
CPC ....... *B01J 20/262* (2013.01); *B01J 20/28033* (2013.01); *B01J 20/3007* (2013.01); *C09J 7/10* (2018.01); *H01L 21/6836* (2013.01); *C09J 2483/00* (2013.01)

(58) Field of Classification Search
CPC ........... C09J 7/10; H01L 21/6836; B32B 5/18
See application file for complete search history.

(56) References Cited

U.S. PATENT DOCUMENTS

| | | |
|---|---|---|
| 9,051,445 B2 | 6/2015 | Nozoe et al. |
| 10,105,929 B2 | 10/2018 | Doi et al. |
| 2011/0021649 A1 | 1/2011 | Sakuma et al. |
| 2011/0190410 A1 | 8/2011 | Nozoe et al. |
| 2012/0237764 A1 | 9/2012 | Soejima et al. |
| 2013/0210301 A1 | 8/2013 | Hirao et al. |
| 2013/0216814 A1 | 8/2013 | Hirao et al. |
| 2013/0224467 A1 | 8/2013 | Hirao et al. |
| 2015/0107669 A1 | 4/2015 | Gotoh et al. |
| 2015/0174865 A1* | 6/2015 | Hatanaka ............... B32B 27/32 428/141 |
| 2016/0053069 A1 | 2/2016 | Gotoh et al. |
| 2016/0221299 A1 | 8/2016 | Doi et al. |
| 2017/0040478 A1 | 2/2017 | Gotoh et al. |
| 2019/0001618 A1 | 1/2019 | Doi et al. |
| 2019/0106602 A1 | 4/2019 | Doi |

FOREIGN PATENT DOCUMENTS

| | | | |
|---|---|---|---|
| CN | 103080230 A | 5/2013 | |
| CN | 103987767 A | 8/2014 | |
| CN | 103999144 A | 8/2014 | |
| CN | 104334673 A | 2/2015 | |
| CN | 104487248 A | 4/2015 | |
| EP | 2792706 A1 * | 10/2014 | ............... B32B 5/18 |
| EP | 2792706 A1 | 10/2014 | |
| EP | 2793212 A1 | 10/2014 | |
| JP | 01-259043 A | 10/1989 | |
| JP | 2008-214625 A | 9/2008 | |
| JP | 2013-18897 A | 1/2013 | |
| JP | 2014-167067 A | 9/2014 | |

(Continued)

OTHER PUBLICATIONS

Office Action issued for corresponding Korean Patent Application No. 10-2019-7028040 dated Dec. 15, 2020, along with an English machine translation.

International Search Report dated Apr. 17, 2018, in connection with counterpart International Patent Application No. PCT/2018/001754.

Office Action issued for corresponding Taiwanese Patent Application No. 107111167 dated Jul. 21, 2021, along with an English translation.

Extended European Search Report issued for corresponding European Application No. 18780991.8 dated Oct. 21, 2020.

Office Action issued for corresponding Chinese patent application No. 201880021989.0 dated Jul. 14, 2021, along with an English machine translation.

*Primary Examiner* — Michael Zhang
(74) *Attorney, Agent, or Firm* — Hauptman Ham, LLP

(57) ABSTRACT

Provided is an adsorption temporary fixing sheet having a sufficient shear adhesive strength in a direction parallel to its surface, and having a weak adhesive strength in a direction vertical to the surface. Also provided is a method of producing such adsorption temporary fixing sheet. The adsorption temporary fixing sheet includes a foam layer including an open-cell structure, wherein, when a silicon chip vertical adhesive strength of a surface of the foam layer after 20 hours at each of such different temperatures as $-40°$ C., $23°$ C., or $125°$ C. is represented by V1 (N/1 cm□), V2 (N/1 cm□), or V3 (N/1 cm□) and when a silicon chip shearing adhesive strength of the surface of the foam layer after 20 hours at each of the different temperatures ($-40°$ C., $23°$ C., or $125°$ C.) is represented by H1 (N/1 cm□), H2 (N/1 cm□), or H3 (N/1 cm□), relationships of V1<H1, V2<H2, and V3<H3 are satisfied.

8 Claims, No Drawings

(56) References Cited

FOREIGN PATENT DOCUMENTS

| | | |
|---|---:|---|
| JP | 5676798 B1 | 1/2015 |
| JP | 5702899 B | 4/2015 |
| JP | 5899128 B2 | 3/2016 |
| JP | 6027422 B2 | 11/2016 |
| KR | 10-2014-0005863 A | 1/2014 |
| TW | 201221564 A1 | 6/2012 |
| TW | 201331038 A1 | 8/2013 |
| WO | 2010/013847 A1 | 2/2010 |
| WO | 2012/029537 A1 | 3/2012 |
| WO | 2013-089094 A1 | 6/2013 |
| WO | 2013/176179 A1 | 11/2013 |
| WO | 2017/110681 A1 | 6/2017 |
| WO | 2017/175512 A1 | 10/2017 |

\* cited by examiner

ADSORPTIVE TEMPORARY FIXING SHEET AND METHOD FOR MANUFACTURING SAME

CROSS-REFERENCE TO RELATED APPLICATION

The present application is a national stage filing under 35 U.S.C § 371 of PCT application number PCT/JP2018/001754 filed on Jan. 22, 2018 which is based upon and claims the benefit of priority to Japanese Patent Application No. 2017-075475, filed on Apr. 5, 2017, in the Japanese Patent Office, which is incorporated herein in its entirety by reference.

TECHNICAL FIELD

The present invention relates to an adsorption temporary fixing sheet. In addition, the present invention relates to a method of producing an adsorption temporary fixing sheet.

BACKGROUND ART

A foam sheet having adsorptivity has heretofore been used as, for example, a sheet for preventing the overturning or slippage of furniture or home electric appliances, a backing material for a carpet, or a sheet that can be bonded and fixed to an automobile interior material, and that can be easily peeled.

A material such as an acrylic resin or a rubber has been mainly used for such foam sheet having adsorptivity (e.g., Patent Literature 1). However, an emulsion-based material has been mainstream, and hence the sheet is excellent in repeelability but has involved the following problem. The sheet is poor in water resistance, and hence when the sheet is washed with water at the time of its contamination, the sheet absorbs water to swell, thereby reducing its adsorptivity.

In addition, in the production of, for example, a display or organic EL lighting in an electronics industry, a material for temporarily fixing a substrate and a fixing base to each other is used at the time of the performance of, for example, the vapor deposition of various metal films and an ITO film onto various film substrates (e.g., polyimide, PET, and PEN), glass, and a Si substrate, sputtering film formation, and pattern formation processing. A repeelable pressure-sensitive adhesive tape has been used as such material because the temporary fixing needs to be released after the film formation. Under the present circumstances, examples of such pressure-sensitive adhesive tape include a tape that is foamed by heating to be peeled, a cooling-peelable tape that can be peeled at low temperature, and an acrylic or silicone-based double-sided tape having a weak pressure-sensitive adhesive property.

However, when heating at a temperature as high as 150° C. or more is needed in the production process, an adhesive residue due to an increase in peel strength of a pressure-sensitive adhesive or the breakage of a substrate has been a problem. In addition, it is feared that the pressure-sensitive adhesive tape includes bubbles at the time of its bonding, and hence the smoothness of the substrate is lost and high-accuracy pattern formation processing is inhibited.

A silicone foam has been recently reported as a foam material that has a light weight, that is excellent in heat resistance and weatherability, and that has a low thermal conductivity. For example, there have been reported a silicone resin foam that contains a silicone resin cured product, and a plurality of particles dispersed in the silicone resin cured product and having cavity portions therein, and that is suitably used in a solar cell application (e.g., Patent Literature 2), and a silicone foam sheet in which cells are densely arranged, the uniformity of the sizes of the cells is high, the shapes of the cells are satisfactory, and a closed-cell ratio is high (e.g., Patent Literature 3).

An adsorption temporary fixing sheet is required to have a sufficient shear adhesive strength in a direction parallel to the surface of the adsorption temporary fixing sheet, and to have a weak adhesive strength in a direction substantially vertical to the surface of the adsorption temporary fixing sheet in some cases depending on its applications. An example of such cases is a case in which, when a member is mounted on the surface of the adsorption temporary fixing sheet arranged in a horizontal direction, the sheet is required to firmly fix the member in a lateral direction, and meanwhile, when the member is picked up in an upward direction, the sheet is required to enable easy peeling of the member.

However, the related-art silicone foam has been unable to sufficiently meet such requirements as described above.

CITATION LIST

Patent Literature

[PTL 1] JP 01-259043 A
[PTL 2] JP 5702899 B2
[PTL 3] JP 2014-167067 A

SUMMARY OF INVENTION

Technical Problem

An object of the present invention is to provide an adsorption temporary fixing sheet having a sufficient shear adhesive strength in a direction parallel to its surface, and having a weak adhesive strength in a direction vertical to the surface. Another object of the present invention is to provide a method of producing such adsorption temporary fixing sheet.

Solution to Problem

According to one embodiment of the present invention, there is provided an adsorption temporary fixing sheet, including a foam layer including an open-cell structure, wherein, when a silicon chip vertical adhesive strength of a surface of the foam layer after 20 hours at −40° C. is represented by V1 (N/1 cm□), a silicon chip vertical adhesive strength thereof after 20 hours at 23° C. is represented by V2 (N/1 cm□), and a silicon chip vertical adhesive strength thereof after 20 hours at 125° C. is represented by V3 (N/1 cm□), and a silicon chip shearing adhesive strength of the surface of the foam layer after 20 hours at −40° C. is represented by H1 (N/1 cm□), a silicon chip shearing adhesive strength thereof after 20 hours at 23° C. is represented by H2 (N/1 cm□), and a silicon chip shearing adhesive strength thereof after 20 hours at 125° C. is represented by H3 (N/1 cm□), relationships of V1<H1, V2<H2, and V3<H3 are satisfied where a silicon chip vertical adhesive strength is defined as follows: a surface opposite to an evaluation surface of the adsorption temporary fixing sheet is fixed onto a smooth stainless-steel plate with a silicone pressure-sensitive adhesive tape; a 2-kilogram roller is reciprocated once to bond a ground surface of a silicon chip having a thickness of 300

μm, which is obtained by grinding a silicon wafer with a grinder (manufactured by DISCO Corporation, DFG8560) and singulating the silicon wafer into a 1 cm□ with a dicing saw (manufactured by DISCO Corporation, DFD6450), to the adsorption temporary fixing sheet, and the resultant is aged at each of −40° C., 23° C., and 125° C. for 20 hours, and is left at rest at 23° C. for 2 hours; a mirror surface (surface opposite to the ground surface) of the silicon chip is compressed with Servopulser (manufactured by Shimadzu Corporation, Controller 4890, Load Cell MMT-250N) under a state in which a double-sided tape (manufactured by Nitto Denko Corporation, No. 5000NS) is bonded to a tip of an adapter of 20 mmΦ at a compression rate of 0.01 N/sec in a vertical direction until a load of 0.05 N is applied thereto, followed by peeling of the silicon chip at 10 mm/sec; and a maximum load at a time of the peeling is defined as the silicon chip vertical adhesive strength, and a silicon chip shearing adhesive strength includes a shear adhesive strength measured as follows: the surface opposite to the evaluation surface of the adsorption temporary fixing sheet is fixed onto a smooth stainless-steel plate with a silicone pressure-sensitive adhesive tape; a 2-kilogram roller is reciprocated once to bond a ground surface of a silicon chip having a thickness of 300 μm, which is obtained by grinding a silicon wafer with a grinder (manufactured by DISCO Corporation, DFG8560) and singulating the silicon wafer into a 1 cm□ with a dicing saw (manufactured by DISCO Corporation, DFD6450), to the adsorption temporary fixing sheet, and the resultant is aged at each of −40° C., 23° C., and 125° C. for 20 hours, and is left at rest at 23° C. for 2 hours; and a side surface of the silicon chip is pressed with a force gauge (manufactured by Nidec-Shimpo Corporation, FGPX-10) at a rate of 1 mm/sec, followed by the measurement of the shear adhesive strength.

In one embodiment, the V1 is 5 N/1 cm□ or less.
In one embodiment, the H1 is 0.5 N/1 cm□ or more.
In one embodiment, the V2 is 6.5 N/1 cm□ or less.
In one embodiment, the H2 is 0.6 N/1 cm□ or more.
In one embodiment, the V3 is 10 N/1 cm□ or less.
In one embodiment, the H3 is 0.7 N/1 cm□ or more.
In one embodiment, the foam layer has an apparent density of from 0.15 g/cm$^3$ to 0.90 g/cm$^3$.
In one embodiment, the surface of the foam layer has an arithmetic average surface roughness Ra of from 1 μm to 10 μm.

According to one embodiment of the present invention, there is provided a method of producing an adsorption temporary fixing sheet including a foam layer including an open-cell structure, including:

applying a resin composition for forming the foam layer onto a separator A;

mounting a separator B on a surface of the applied resin composition opposite to the separator A;

thermally curing the resin composition; and then peeling at least one kind selected from the separator A and the separator B, wherein at least one kind of the peeled separator(s) includes a separator having a surface having an arithmetic average surface roughness Ra of from 0.1 μm to 5 μm.

Advantageous Effects of Invention

According to the present invention, the adsorption temporary fixing sheet having a sufficient shear adhesive strength in a direction parallel to its surface, and having a weak adhesive strength in a direction vertical to the surface can be provided. The method of producing such adsorption temporary fixing sheet can also be provided.

DESCRIPTION OF EMBODIMENTS

<<Adsorption Temporary Fixing Sheet>>

An adsorption temporary fixing sheet of the present invention is an adsorption temporary fixing sheet including a foam layer having an open-cell structure.

Examples of the form of the adsorption temporary fixing sheet of the present invention include: such a form that the sheet includes the foam layer in its entirety; and such a form that the sheet partially includes the foam layer and at least one of the outermost layers of the sheet is the foam layer.

In the adsorption temporary fixing sheet of the present invention, a separator may be bonded to the surface of the foam layer, for example, until the sheet is used. When such separator is not caused to function as a support, the separator is preferably peeled from the surface of the foam layer before a member that is to be temporarily fixed is mounted on the adsorption temporary fixing sheet of the present invention.

The adsorption temporary fixing sheet of the present invention has the following feature because the foam layer in the sheet has the open-cell structure: an adherend can be bonded and temporarily fixed to the sheet while the inclusion of bubbles is prevented.

In the adsorption temporary fixing sheet of the present invention, when a silicon chip vertical adhesive strength of the surface of the foam layer in the sheet after 20 hours at −40° C. is represented by V1 (N/1 cm□), a silicon chip vertical adhesive strength thereof after 20 hours at 23° C. is represented by V2 (N/1 cm□), and a silicon chip vertical adhesive strength thereof after 20 hours at 125° C. is represented by V3 (N/1 cm□), and a silicon chip shearing adhesive strength of the surface of the foam layer in the sheet after 20 hours at −40° C. is represented by H1 (N/1 cm□), a silicon chip shearing adhesive strength thereof after 20 hours at 23° C. is represented by H2 (N/1 cm□), and a silicon chip shearing adhesive strength thereof after 20 hours at 125° C. is represented by H3 (N/1 cm□), relationships of V1<H1, V2<H2, and V3<H3 are satisfied. The adsorption temporary fixing sheet of the present invention can have a sufficient shear adhesive strength in a direction parallel to the surface, and can have a weak adhesive strength in a direction vertical to the surface by having the relationships of V1<H1, V2<H2, and V3<H3 as described above.

As described above, in the adsorption temporary fixing sheet of the present invention, the silicon chip vertical adhesive strength is smaller than the silicon chip shearing adhesive strength under any one of the following conditions: after 20 hours at −40° C.; after 20 hours at 23° C.; and after 20 hours at 125° C. Accordingly, the sheet can have a sufficient shear adhesive strength in the direction parallel to the surface, and can have a weak adhesive strength in the direction vertical to the surface preferably in a wide temperature region from low temperature to high temperature.

The silicon chip vertical adhesive strength is defined as follows: a surface opposite to an evaluation surface of the adsorption temporary fixing sheet is fixed onto a smooth stainless-steel plate with a silicone pressure-sensitive adhesive tape; a 2-kilogram roller is reciprocated once to bond a ground surface of a silicon chip having a thickness of 300 μm, which is obtained by grinding a silicon wafer with a grinder (manufactured by DISCO Corporation, DFG8560) and singulating the silicon wafer into a 1 cm□ with a dicing saw (manufactured by DISCO Corporation, DFD6450), to the adsorption temporary fixing sheet, and the resultant is aged at each of −40° C., 23° C., and 125° C. for 20 hours, and is left at rest at 23° C. for 2 hours; a mirror surface (surface opposite to the ground surface) of the silicon chip is compressed with Servopulser (manufactured by Shimadzu Corporation, Controller 4890, Load Cell MMT-250N) under a state in which a double-sided tape (manufactured by Nitto Denko Corporation, No. 5000NS) is bonded to a tip of an adapter of 20 mmΦ at a compression rate of 0.01 N/sec in a vertical direction until a load of 0.05 N is applied thereto, followed by peeling of the silicon chip at 10 mm/sec; and a maximum load at a time of the peeling is defined as the silicon chip vertical adhesive strength.

The silicon chip shearing adhesive strength is a shear adhesive strength measured as follows: the surface opposite to the evaluation surface of the adsorption temporary fixing sheet is fixed onto a smooth stainless-steel plate with a silicone pressure-sensitive adhesive tape; a 2-kilogram roller is reciprocated once to bond a ground surface of a silicon chip having a thickness of 300 μm, which is obtained by grinding a silicon wafer with a grinder (manufactured by DISCO Corporation, DFG8560) and singulating the silicon wafer into a 1 cm□ with a dicing saw (manufactured by DISCO Corporation, DFD6450), to the adsorption temporary fixing sheet, and the resultant is aged at each of −40° C., 23° C., and 125° C. for 20 hours, and is left at rest at 23° C. for 2 hours; and a side surface of the silicon chip is pressed with a force gauge (manufactured by Nidec-Shimpo Corporation, FGPX-10) at a rate of 1 mm/sec, followed by the measurement of the shear adhesive strength.

The V1 (the silicon chip vertical adhesive strength of the surface of the foam layer after 20 hours at −40° C.) is preferably 5 N/1 cm□ or less, more preferably from 0.1 N/1 cm□ to 4.5 N/1 cm□, still more preferably from 0.2 N/1 cm□ to 4 N/1 cm□, particularly preferably from 0.3 N/1 cm□ to 3.5 N/1 cm□. When the V1 falls within the range, the adsorption temporary fixing sheet of the present invention can temporarily fix a member that is to be adsorbed and temporarily fixed, and can have a weaker adhesive strength in the direction vertical to the surface in a low-temperature region.

The H1 (the silicon chip shear adhesive strength of the surface of the foam layer after 20 hours at −40° C.) is preferably 0.5 N/1 cm□ or more, more preferably from 0.7 N/1 cm□ to 40 N/1 cm□, still more preferably from 0.8 N/cm□ to 35N/cm□, particularly preferably from 0.9 N/1 cm□ to 30 N/1 cm□. When the H1 falls within the range, the adsorption temporary fixing sheet of the present invention can temporarily fix the member that is to be adsorbed and temporarily fixed, and can have a more sufficient shear adhesive strength in the direction parallel to the surface in the low-temperature region.

The V2 (the silicon chip vertical adhesive strength of the surface of the foam layer after 20 hours at 23° C.) is preferably 6.5 N/1 cm□ or less, more preferably from 0.1 N/1 cm□ to 5.5 N/1 cm□, still more preferably from 0.2 N/1 cm□ to 5 N/1 cm□, particularly preferably from 0.3 N/1 cm□ to 4.5 N/1 cm□. When the V2 falls within the range, the adsorption temporary fixing sheet of the present invention can temporarily fix a member that is to be adsorbed and temporarily fixed, and can have a weaker adhesive strength in the direction vertical to the surface in a temperature region around room temperature.

The H2 (the silicon chip shear adhesive strength of the surface of the foam layer after 20 hours at 23° C.) is preferably 0.6 N/1 cm□ or more, more preferably from 0.7 N/1 cm□ to 40 N/1 cm□, still more preferably from 0.8N/1 cm□ to 35N/1 cm□, particularly preferably from 0.9 N/1 cm□ to 30 N/1 cm□. When the H2 falls within the range, the adsorption temporary fixing sheet of the present invention can temporarily fix the member that is to be adsorbed and temporarily fixed, and can have a more sufficient shear adhesive strength in the direction parallel to the surface in the temperature region around room temperature.

The V3 (the silicon chip vertical adhesive strength of the surface of the foam layer after 20 hours at 125° C.) is preferably 10 N/1 cm□ or less, more preferably from 0.1 N/1 cm□ to 9.6 N/1 cm□, still more preferably from 0.2 N/1 cm□ to 9.2 N/1 cm□, particularly preferably from 0.3 N/1 cm□ to 8.8 N/1 cm□. When the V3 falls within the range, the adsorption temporary fixing sheet of the present invention can temporarily fix a member that is to be adsorbed and temporarily fixed, and can have a weaker adhesive strength in the direction vertical to the surface in a high-temperature region.

The H3 (the silicon chip shear adhesive strength of the surface of the foam layer after 20 hours at 125° C.) is preferably 0.7 N/1 cm□ or more, more preferably from 0.8 N/1 cm□ to 40 N/1 cm□, still more preferably from 0.9 N/1 cm□ to 35 N/1 cm□, particularly preferably from 1 N/1 cm□ to 30 N/1 cm□. When the H3 falls within the range, the adsorption temporary fixing sheet of the present invention can temporarily fix the member that is to be adsorbed and temporarily fixed, and can have a more sufficient shear adhesive strength in the direction parallel to the surface in the high-temperature region.

Any appropriate thickness may be adopted as the thickness of the foam layer in accordance with purposes. The thickness of the foam layer is preferably from 10 μm to 3,500 μm, more preferably from 20 μm to 2,500 μm, still more preferably from 30 μm to 1,500 μm, particularly preferably from 40 μm to 950 μm, most preferably from 50 μm to 800 μm. Even when the thickness of the foam layer is small as described above, the adsorption temporary fixing sheet of the present invention can exhibit an excellent temporary fixing property.

The foam layer preferably has cells (spherical bubbles). The cells (spherical bubbles) may not be strictly spherical bubbles, and may be, for example, substantially spherical bubbles partially having strains or bubbles formed of spaces having large strains.

The foam layer preferably has the open-cell structure. That is, the foam layer preferably has an open-cell structure having a through-hole between adjacent cells. When the foam layer has the open-cell structure, through the combination of this feature with any other feature of the foam layer, the adsorption temporary fixing sheet exhibits the following effects: the sheet can exhibit excellent bubble removability; an adherend can be bonded and temporarily fixed to the sheet while the inclusion of bubbles is further prevented; and the sheet can be more easily peeled without any adhesive residue when the temporary fixing is released. In addition, even when the thickness of the foam layer is reduced, the exhibition of those effects can be maintained.

Whether or not the open-cell structure is present may be confirmed by capturing an enlarged image of a section of the foam layer with a low-vacuum scanning electron microscope ("S-3400N Scanning Electron Microscope", manufactured by Hitachi High-Tech Fielding Corporation), and observing the presence or absence of a through-hole on a cell wall.

The open-cell ratio of the foam layer is preferably 90% or more, more preferably from 90% to 100%, still more preferably from 92% to 100%, still further more preferably from 95% to 100%, particularly preferably from 99% to 100%, most preferably substantially 100%. When the open-cell ratio of the foam layer falls within the range, through the combination of this feature with any other feature of the foam layer, the adsorption temporary fixing sheet exhibits the following effects: the sheet can exhibit more excellent bubble removability; an adherend can be bonded and temporarily fixed to the sheet while the inclusion of bubbles is even further prevented; and the sheet can be even more easily peeled without any adhesive residue when the temporary fixing is released. In addition, even when the thickness of the foam layer is reduced, the exhibition of those effects can be further maintained.

For example, the open-cell ratio may be measured as described below. Specifically, the foam layer is sunk in water, and is left to stand under a reduced pressure of −750 mmHg for 3 minutes so that air in its bubbles is replaced with the water. The mass of the absorbed water is measured, and the volume of the absorbed water is calculated by defining the density of the water as 1.0 g/cm$^3$, followed by the calculation of the open-cell ratio from the following equation.

Open-cell ratio (%)={(volume of absorbed water)/(volume of bubble portions)}×100

For example, the volume of the bubble portions is calculated from the following equation. Herein, the resin density is a value obtained by measuring the density of a resin molded body produced by removing an emulsifying agent in a resin forming the foam layer.

Volume (cm$^3$) of bubble portions={(mass of foam (foam sheet))/(apparent density of foam (foam sheet))}−{(mass of foam (foam sheet))/(resin density)}

The average cell diameter of the foam layer is preferably from 1 μm to 200 μm, more preferably from 1.5 μm to 180 μm, still more preferably from 2 μm to 170 μm, particularly preferably from 2.5 μm to 160 μm, most preferably from 3 μm to 150 μm. When the average cell diameter of the foam layer falls within the range, through the combination of this feature with any other feature of the foam layer, the adsorption temporary fixing sheet exhibits the following effects: the sheet can exhibit more excellent bubble removability; an adherend can be bonded and temporarily fixed to the sheet while the inclusion of bubbles is even further prevented; and the sheet can be even more easily peeled without any adhesive residue when the temporary fixing is released. In addition, even when the thickness of the foam layer is reduced, the exhibition of those effects can be further maintained.

In the foam layer, it is preferred that 90% or more of all the cells each have a cell diameter of 300 μm or less, it is more preferred that 92% or more of all the cells each have a cell diameter of 300 μm or less, it is still more preferred that 95% or more of all the cells each have a cell diameter of 300 μm or less, it is particularly preferred that 97% or more of all the cells each have a cell diameter of 300 μm or less, and it is most preferred that substantially 100% of all the cells each have a cell diameter of 300 μm or less. In addition, in the foam layer, it is more preferred that 90% or more of all the cells each have a cell diameter of 250 μm or less, it is still more preferred that 90% or more of all the cells each have a cell diameter of 200 μm or less, it is particularly preferred that 90% or more of all the cells each have a cell diameter of 180 μm or less, and it is most preferred that 90% or more of all the cells each have a cell diameter of 150 μm or less. When the ratio of cells each having a cell diameter of 300 μm or less in the foam layer and the cell diameters of 90% or more of all the cells in the foam layer fall within the ranges, through the combination of this feature with any other feature of the foam layer, the adsorption temporary fixing sheet exhibits the following effects: the sheet can exhibit more excellent bubble removability; an adherend can be bonded and temporarily fixed to the sheet while the inclusion of bubbles is even further prevented; and the sheet can be even more easily peeled without any adhesive residue when the temporary fixing is released. In addition, even when the thickness of the foam layer is reduced, the exhibition of those effects can be further maintained.

A maximum cell diameter in all the cells in the foam layer is preferably 300 μm or less, more preferably 250 μm or less, still more preferably 200 μm or less, particularly preferably 180 μm or less, most preferably 150 μm or less. When the maximum cell diameter in all the cells in the foam layer falls within the range, through the combination of this feature with any other feature of the foam layer, the adsorption temporary fixing sheet exhibits the following effects: the sheet can exhibit more excellent bubble removability; an adherend can be bonded and temporarily fixed to the sheet while the inclusion of bubbles is even further prevented; and the sheet can be even more easily peeled without any adhesive residue when the temporary fixing is released. In addition, even when the thickness of the foam layer is reduced, the exhibition of those effects can be further maintained.

A minimum cell diameter in all the cells in the foam layer is preferably 100 μm or less, more preferably 80 μm or less, still more preferably 70 μm or less, particularly preferably 60 μm or less, most preferably 50 μm or less. When the minimum cell diameter in all the cells in the foam layer falls within the range, through the combination of this feature with any other feature of the foam layer, the adsorption temporary fixing sheet exhibits the following effects: the sheet can exhibit more excellent bubble removability; an adherend can be bonded and temporarily fixed to the sheet while the inclusion of bubbles is even further prevented; and the sheet can be even more easily peeled without any adhesive residue when the temporary fixing is released. In addition, even when the thickness of the foam layer is reduced, the exhibition of those effects can be further maintained.

Thus, when the foam layer preferably has the open-cell structure and its cell diameters are preferably fine as described above, the adsorption temporary fixing sheet of the present invention is suitable as an adsorption temporary fixing sheet because the sheet exhibits the following effects: the sheet can exhibit excellent bubble removability; an adherend can be bonded and temporarily fixed to the sheet while the inclusion of bubbles is prevented; and the sheet can be peeled without any adhesive residue when the temporary fixing is released.

The average cell diameter may be determined by, for example, capturing an enlarged image of a section of the foam layer with a low-vacuum scanning electron microscope ("S-3400N Scanning Electron Microscope", manufactured by Hitachi High-Tech Science Systems Corporation) and analyzing the image. The number of cells to be analyzed is, for example, 20. The minimum cell diameter (μm) and the maximum cell diameter (μm) may each be determined by the same method.

The foam layer preferably has surface opening portions. The term "surface opening portions" as used herein means opening portions that are present in the surface of the foam layer and have an average pore diameter of a certain size.

When the foam layer has the surface opening portions, the adsorption temporary fixing sheet of the present invention exhibits the following effects: an adherend can be bonded and temporarily fixed to the sheet while the inclusion of bubbles is further prevented; and the sheet can be more easily peeled without any adhesive residue when the temporary fixing is released. This is probably because the surface opening portions serve as appropriate suckers. Thus, the adsorption temporary fixing sheet of the present invention including the foam layer can further exhibit such an excellent temporary fixing property as described above.

The opening ratio of the surface opening portions is preferably from 1% to 99%, more preferably from 2% to 95%, still more preferably from 3% to 90%, particularly preferably from 4% to 85%, most preferably from 5% to 80%. When the opening ratio of the surface opening portions falls within the range, the adsorption temporary fixing sheet of the present invention exhibits the following effects: an adherend can be bonded and temporarily fixed to the sheet while the inclusion of bubbles is further prevented; and the sheet can be more easily peeled without any adhesive residue when the temporary fixing is released.

The average pore diameter of the surface opening portions is preferably 150 μm or less, more preferably from 0.5 μm to 145 μm, still more preferably from 1.0 μm to 140 μm, particularly preferably from 1.5 μm to 135 μm, most preferably from 2.0 μm to 130 μm. When the average pore diameter of the surface opening portions falls within the range, the adsorption temporary fixing sheet of the present invention exhibits the following effects: an adherend can be bonded and temporarily fixed to the sheet while the inclusion of bubbles is further prevented; and the sheet can be more easily peeled without any adhesive residue when the temporary fixing is released.

The average pore diameter of the surface opening portions may be determined by, for example, capturing an enlarged image of the surface of the foam layer with a low-vacuum scanning electron microscope ("S-3400N Scanning Electron Microscope", manufactured by Hitachi High-Tech Fielding Corporation) and analyzing the image. The number of pores to be analyzed is, for example, 20.

The apparent density of the foam layer is preferably from 0.15 g/cm$^3$ to 0.90 g/cm$^3$, more preferably from 0.20 g/cm$^3$ to 0.85 g/cm$^3$, still more preferably from 0.25 g/cm$^3$ to 0.80 g/cm$^3$, particularly preferably from 0.30 g/cm$^3$ to 0.75 g/cm$^3$. When the apparent density of the foam layer falls within the range, through the combination of this feature with any other feature of the foam layer, the adsorption temporary fixing sheet exhibits the following effects: an adherend can be bonded and temporarily fixed to the sheet while the inclusion of bubbles is further prevented; and the sheet can be more easily peeled without any adhesive residue when the temporary fixing is released. In addition, even when the thickness of the foam layer is reduced, the exhibition of those effects can be maintained.

The surface of the foam layer has an arithmetic average surface roughness Ra of preferably from 0.1 μm to 10 μm, more preferably from 0.2 μm to 9 μm, still more preferably from 0.3 μm to 8.5 μm, particularly preferably from 0.4 μm to 8 μm. When the surface of the foam layer has an arithmetic average surface roughness Ra falling within such range, the adsorption temporary fixing sheet of the present invention can have a more sufficient shear adhesive strength in a direction parallel to the surface, and can have a weaker adhesive strength in a direction vertical to the surface.

A separator may be attached to the surface of the foam layer, for example, before use. When such separator is not caused to function as a support, the separator is preferably peeled from the surface of the foam layer before a member to be temporarily fixed is placed on the adsorption temporary fixing sheet of the present invention.

The thickness of the separator is preferably from 1 μm to 500 μm, more preferably from 3 μm to 450 μm, still more preferably from 5 μm to 400 μm, particularly preferably from 10 μm to 300 μm.

Examples of the separator include paper, a plastic film, a polytetrafluoroethylene (PTFE) film, and a plastic film having a surface subjected to silicone treatment or fluorinated silicone treatment.

Examples of the plastic film include a polyethylene film, a polypropylene film, a polybutene film, a polybutadiene film, a polymethylpentene film, a polyvinyl chloride film, a vinyl chloride copolymer film, a polyethylene terephthalate film, a polybutylene terephthalate film, a polyethylene naphthalate film, a polyurethane film, an ethylene-vinyl acetate copolymer film, a polyimide film, a polyamide (nylon) film, and an aromatic polyamide (aramid) film.

In particular, from the viewpoint that the effects of the present invention can be further exhibited, it is preferred that any such plastic film not subjected to surface treatment, such as silicone treatment or fluorinated silicone treatment, be attached to at least one surface of the foam layer as the separator. Such separator is particularly preferably a polyethylene terephthalate (PET) film not subjected to surface treatment, such as silicone treatment or fluorinated silicone treatment.

Such separator has, on a surface thereof, an arithmetic average surface roughness Ra of preferably from 0.1 μm to 5 μm, more preferably from 0.15 μm to 4.5 μm, still more preferably from 0.2 μm to 4 μm, particularly preferably from 0.22 μm to 3.5 μm. When a separator having a surface having an arithmetic average surface roughness Ra falling within the such range is adopted, the adsorption temporary fixing sheet of the present invention can have a more sufficient shear adhesive strength in a direction parallel to the surface, and can have a weaker adhesive strength in a direction vertical to the surface by peeling such separator from the surface of the foam layer before a member to be temporarily fixed is placed on the adsorption temporary fixing sheet of the present invention.

The adsorption temporary fixing sheet according to one embodiment of the present invention includes a support on one surface side of the foam layer. In this embodiment, a separator may be attached to the other surface of the foam layer, for example, before use. Such separator is preferably the separator having a surface having an arithmetic average surface roughness Ra of preferably from 0.1 μm to 5 μm as described above.

The adsorption temporary fixing sheet according to one embodiment of the present invention includes a pressure-sensitive adhesive layer on one surface side of the foam layer. In this embodiment, separators may be attached to the other surface of the foam layer and the other surface of the pressure-sensitive adhesive layer, for example, before use. Of those separators, the separator to be attached to the other surface of the foam layer is preferably the separator having a surface having an arithmetic average surface roughness Ra of preferably from 0.1 μm to 5 μm as described above.

The adsorption temporary fixing sheet according to one embodiment of the present invention includes a support on one surface side of the foam layer, and further includes a pressure-sensitive adhesive layer on a surface side of the support opposite to the foam layer. That is, the adsorption temporary fixing sheet has a form of foam layer/support/ pressure-sensitive adhesive layer. In this embodiment, separators may be attached to the other surface of the foam layer and the other surface of the pressure-sensitive adhesive layer, for example, before use. Of those separators, the separator to be attached to the other surface of the foam layer is preferably the separator having a surface having an arithmetic average surface roughness Ra of preferably from 0.1 µm to 5 µm as described above.

The adsorption temporary fixing sheet according to one embodiment of the present invention includes a support on one surface side of the foam layer, and further includes another foam layer on a surface side of the support opposite to the foam layer. That is, the adsorption temporary fixing sheet has a form of foam layer/support/foam layer. In this embodiment, a separator may be attached to the other surface of one of the foam layers, for example, before use. Such separator is preferably the separator having a surface having an arithmetic average surface roughness Ra of preferably from 0.1 µm to 5 µm as described above.

Any appropriate support may be adopted as the support as long as the support can support the foam layer. Examples of such support include: a plastic film, sheet, or tape; paper; a nonwoven fabric; a metal foil or a metal mesh; and glass or a glass cloth. The number of the supports may be one, or may be two or more. In addition, in order that an anchoring property between the support and the foam layer may be improved, it is preferred that an undercoating agent, such as a silane coupling agent, be applied to the surface of the support, or the surface be subjected to surface treatment, such as corona treatment or plasma treatment.

Examples of the plastic film include a polyethylene film, a polypropylene film, a polybutene film, a polybutadiene film, a polymethylpentene film, a polyvinyl chloride film, a vinyl chloride copolymer film, a polyethylene terephthalate film, a polybutylene terephthalate film, a polyethylene naphthalate film, a polyurethane film, an ethylene-vinyl acetate copolymer film, a polyimide film, a polyamide (nylon) film, and an aromatic polyamide (aramid) film.

A layer formed of any appropriate pressure-sensitive adhesive may be adopted as the pressure-sensitive adhesive layer. Examples of such pressure-sensitive adhesive include a rubber-based pressure-sensitive adhesive (e.g., a synthetic rubber-based pressure-sensitive adhesive or a natural rubber-based pressure-sensitive adhesive), a urethane-based pressure-sensitive adhesive, an acrylic urethane-based pressure-sensitive adhesive, an acrylic pressure-sensitive adhesive, a silicone-based pressure-sensitive adhesive, a polyester-based pressure-sensitive adhesive, a polyamide-based pressure-sensitive adhesive, an epoxy-based pressure-sensitive adhesive, a vinyl alkyl ether-based pressure-sensitive adhesive, and a fluorine-based pressure-sensitive adhesive. Those pressure-sensitive adhesives may be used alone or in combination thereof. The number of the pressure-sensitive adhesive layers may be one, or may be two or more.

The pressure-sensitive adhesives are classified into, for example, an emulsion-type pressure-sensitive adhesive, a solvent-type pressure-sensitive adhesive, an ultraviolet-cross-linkable (UV-cross-linkable) pressure-sensitive adhesive, an electron beam-cross-linkable (EB-cross-linkable) pressure-sensitive adhesive, and a hot-melt pressure-sensitive adhesive in terms of a pressure-sensitive adhesion form. Those pressure-sensitive adhesives may be used alone or in combination thereof.

In the adsorption temporary fixing sheet according to one embodiment of the present invention, any appropriate foam layer may be adopted to the extent that the effects of the present invention are not impaired. Examples of such foam layer include a silicone foam layer and an acrylic foam layer.

In one embodiment, the foam layer is a silicone foam layer.

The silicone foam layer is preferably formed by the heat curing of a silicone resin composition.

The silicone resin composition is preferably such a composition as described below.

The silicone resin composition includes at least: (A) 100 parts by mass of an organopolysiloxane having at least two alkenyl groups in a molecule thereof; (B) an organopolysiloxane having at least two silicon atom-bonded hydrogen atoms in a molecule thereof in such an amount that the number of moles of the silicon atom-bonded hydrogen atoms in the component (B) is from 0.4 mol to 20 mol with respect to 1 mol of the alkenyl groups in the component (A); (C) 100 parts by mass to 1,000 parts by mass of a mixture including water and an inorganic thickener; (D) 0.1 part by mass to 15 parts by mass of surfactants including (D-1) a nonionic surfactant having an HLB value of 3 or more and (D-2) a nonionic surfactant having an HLB value of less than 3, provided that the mass ratio of the component (D-1) to the component (D-2) is at least 1; (E) a hydrosilylation reaction catalyst; and (F) 0.001 part by mass to 5 parts by mass of a curing retarder.

The component (A) is the organopolysiloxane having at least two alkenyl groups in a molecule thereof, and is the main agent of the composition. Examples of the alkenyl groups in the component (A) include a vinyl group, an allyl group, and a hexenyl group. Of those, a vinyl group is preferred. In addition, examples of a silicon atom-bonded organic group except the alkenyl groups in the component (A) include: alkyl groups, such as a methyl group, an ethyl group, a propyl group, a butyl group, a pentyl group, and a hexyl group; aryl groups, such as a phenyl group, a tolyl group, and a xylyl group; aralkyl groups, such as a benzyl group and a phenethyl group; and halogen-substituted alkyl groups, such as a 3,3,3-trifluoropropyl group. Of those, a methyl group is preferred.

Specific examples of the component (A) include dimethylpolysiloxane blocked with a dimethylvinylsiloxy group, a dimethylsiloxane-methylphenylsiloxane copolymer blocked with a dimethylvinylsiloxy group, methylvinylpolysiloxane blocked with a trimethylsiloxy group, a dimethylsiloxane-methylvinylsiloxane copolymer blocked with a trimethylsiloxy group, and a dimethylsiloxane-methylvinylsiloxane-methylphenylsiloxane copolymer blocked with a trimethylsiloxy group. Of those, diorganopolysiloxane having a substantially linear main chain is preferred.

The component (B) is the organopolysiloxane having at least two silicon atom-bonded hydrogen atoms in a molecule thereof, and is the cross-linking agent of the composition. The bonding positions of the silicon atom-bonded hydrogen atoms in the component (B) are not limited, and are, for example, a molecular chain terminal and/or a molecular chain side chain. Examples of a silicon atom-bonded organic group except the hydrogen atoms in the component (B) include: alkyl groups, such as a methyl group, an ethyl group, a propyl group, a butyl group, a pentyl group, and a hexyl group; aryl groups, such as a phenyl group, a tolyl group, and a xylyl group; aralkyl groups, such as a benzyl group and a phenethyl group; and halogen-substituted alkyl groups, such as a 3,3,3-trifluoropropyl group. Of those, a methyl group is preferred.

Examples of such component (B) include dimethylpolysiloxane blocked with a dimethylhydrogensiloxy group, a dimethylsiloxane-methylhydrogensiloxane copolymer blocked with a dimethylhydrogensiloxy group, methylhydrogenpolysiloxane blocked with a trimethylsiloxy group, a dimethylsiloxane-methylhydrogensiloxane copolymer blocked with a trimethylsiloxy group, and an organopolysiloxane including a siloxane unit represented by $(CH_3)_3SiO_{1/2}$, a siloxane unit represented by $H(CH_3)_2SiO_{1/2}$, and a siloxane unit represented by $SiO_{4/2}$. Of those, a linear organopolysiloxane is preferred.

The content of the component (B) is such an amount that the number of moles of the silicon atom-bonded hydrogen atoms in the component (B) falls within the range of from 0.4 mol to 20 mol with respect to 1 mol of the alkenyl groups in the component (A), preferably such an amount that the number falls within the range of from 1.5 mol to 20 mol, more preferably such an amount that the number falls within the range of from 1.5 mol to 10 mol. This is because when the number of moles of the silicon atom-bonded hydrogen atoms in the component (B) falls within the range, the compression set of a silicone foam sheet to be obtained is improved.

The component (C) is the mixture including the water and the inorganic thickener, and is a component for providing a silicone rubber sponge through the removal of the water in the component (C) from a silicone rubber obtained by cross-linking the composition. The water in the component (C) is preferably ion-exchanged water because the component (C) is stably dispersed in the component (A).

The inorganic thickener in the component (C) is blended for increasing the viscosity of the water so that the component (C) may be easily dispersed in the component (A) and hence the state of dispersion of the component (C) may be stabilized. As the inorganic thickener, there are given natural or synthetic inorganic thickeners. Examples thereof include: natural or synthetic smectite clays, such as bentonite, montmorillonite, hectorite, saponite, sauconite, beidellite, and nontronite; magnesium aluminum silicate; and composites of those compounds and water-soluble organic polymers, such as a carboxyvinyl polymer. Of those, smectite clays, such as bentonite and montmorillonite, are preferred. For example, SUMECTON SA (manufactured by Kunimine Industries Co., Ltd.) serving as a hydrothermally synthesized product or BENGEL (manufactured by Hojun Co., Ltd.) serving as a naturally purified product is available as such smectite clay. The pH of such smectite clay preferably falls within the range of from 5.0 to 9.0 in terms of the maintenance of the heat resistance of the silicone rubber sponge. In addition, the content of the inorganic thickener in the component (C) preferably falls within the range of from 0.1 part by mass to 10 parts by mass, and more preferably falls within the range of from 0.5 part by mass to 5 parts by mass with respect to 100 parts by mass of the water.

The content of the component (C) falls within the range of from 100 parts by mass to 1,000 parts by mass, preferably falls within the range of from 100 parts by mass to 800 parts by mass, more preferably falls within the range of from 100 parts by mass to 500 parts by mass, still more preferably falls within the range of from 200 parts by mass to 500 parts by mass, and particularly preferably falls within the range of from 200 parts by mass to 350 parts by mass with respect to 100 parts by mass of the component (A). This is because of the following reasons: when the content of the component (C) is equal to or more than a lower limit for the range, a low-density silicone foam sheet can be formed; meanwhile, when the content is equal to or less than an upper limit for the range, a silicone foam sheet having a uniform and fine open-cell structure can be formed.

The surfactants serving as the component (D) include (D-1) the nonionic surfactant having an HLB value of 3 or more and (D-2) the nonionic surfactant having an HLB value of less than 3. Examples of the surfactants serving as the component (D) include a glycerin fatty acid ester, a polyglycerin fatty acid ester, a sorbitan fatty acid ester, a sucrose fatty acid ester, a polyethylene glycol fatty acid ester, a polypropylene glycol fatty acid ester, a polyoxyethylene glycerin fatty acid ester, a polyoxyethylene sorbitan fatty acid ester, a polyoxyethylene-polyoxypropylene block copolymer, a polyoxyethylene alkyl ether, a polyoxyethylene alkyl phenyl ether, and a polyoxyethylene fatty acid amide.

The component (D) includes the component (D-1) and the component (D-2), and the mass ratio of the component (D-1) to the component (D-2) is at least 1, preferably at least 5, more preferably at least 8, still more preferably at least 10, particularly preferably at least 15. In addition, the mass ratio of the component (D-1) to the component (D-2) is preferably at most 100, more preferably at most 80, at most 70, at most 60, or at most 50. This is because of the following reasons: when the mass ratio is more than the lower limit, a low-density silicone foam sheet having a uniform and fine open-cell structure can be formed; meanwhile, when the mass ratio is less than the upper limit, the component (C) can be dispersed in the component (A) and the component (B) with satisfactory stability, and as a result, a silicone foam sheet having a uniform and fine open-cell structure can be formed.

The content of the component (D) falls within the range of from 0.1 part by mass to 15 parts by mass, preferably falls within the range of from 0.2 part by mass to 3 parts by mass with respect to 100 parts by mass of the component (A). This is because of the following reasons: when the content of the component (D) is equal to or more than a lower limit for the range, a silicone foam sheet having a uniform and fine open-cell structure can be formed; meanwhile, when the content is equal to or less than an upper limit for the range, a silicone foam sheet excellent in heat resistance can be formed.

The component (E) is the hydrosilylation reaction catalyst for accelerating the hydrosilylation reaction of the silicone resin composition, and examples thereof include a platinum-based catalyst, a palladium-based catalyst, and a rhodium-based catalyst. Of those, a platinum-based catalyst is preferred. Examples of such component (E) include: chloroplatinic acid; an alcohol-modified chloroplatinic acid; a coordination compound of chloroplatinic acid and an olefin, vinylsiloxane, or an acetylene compound; a coordination compound of platinum and an olefin, vinylsiloxane, or an acetylene compound; tetrakis(triphenylphosphine)palladium; and chlorotris(triphenylphosphine)rhodium.

The content of the component (E) is an amount enough to cross-link the silicone resin composition. Specifically, the content is preferably such an amount that the content of a catalytic metal in the component (E) falls within the range of from 0.01 ppm to 500 ppm in terms of a mass with respect to the total amount of the component (A) and the component (B), and is more preferably such an amount that the content falls within the range of from 0.1 ppm to 100 ppm.

(F) The curing retarder may be incorporated for adjusting the curing rate and working pot life of the silicone resin composition. Examples of such component (F) include alkyne alcohols, such as 3-methyl-1-butyn-3-ol, 3,5-dimethyl-1-hexyn-3-ol, 3-phenyl-1-butyn-3-ol, and 1-ethynyl-1-cyclohexanol. The content of the component (F), which is appropriately selected in accordance with a use method and molding method for the silicone resin composition, generally falls within the range of from 0.001 part by mass to 5 parts by mass with respect to 100 parts by mass of the component (A).

(G) Reinforcing silica fine powder may be further incorporated into the silicone resin composition in terms of an improvement in strength of the silicone foam sheet to be obtained. Such component (G) is silica fine powder having a BET specific surface area of preferably from 50 $m^2$/g to 350 $m^2$/g, more preferably from 80 $m^2$/g to 250 $m^2$/g, and examples thereof include fumed silica and precipitated silica. In addition, such silica fine powder may be subjected to surface treatment with an organosilane or the like.

The content of the component (G) is at most 20 parts by mass, preferably at most 15 parts by mass, more preferably at most 10 parts by mass with respect to 100 parts by mass of the component (A). In addition, the content of the component (G) is preferably at least 0.1 part by mass with respect to 100 parts by mass of the component (A).

A pigment, such as carbon black or red oxide, may be incorporated into the silicone resin composition to the extent that the object of the present invention is not impaired.

The silicone resin composition may be easily produced by uniformly mixing the respective components or a composition obtained by blending the components with various additives as required with known kneading means. Examples of a mixer to be used in this case include a homomixer, a paddle mixer, a homodisper, a colloid mill, a vacuum mixing/stirring mixer, and a rotation-revolution mixer. However, the mixer is not particularly limited as long as the component (C) and the component (D) can be sufficiently dispersed in the component (A).

<<Method of Producing Adsorption Temporary Fixing Sheet>>

A method of producing an adsorption temporary fixing sheet of the present invention is a method of producing an adsorption temporary fixing sheet including a foam layer having an open-cell structure, including: applying a resin composition for forming the foam layer onto a separator A; mounting a separator B on a surface of the applied resin composition opposite to the separator A; thermally curing the resin composition; and then peeling at least one kind selected from the separator A and the separator B, wherein at least one kind of the peeled separator(s) includes a separator having a surface having an arithmetic average surface roughness Ra of from 0.1 μm to 5 μm.

The arithmetic average surface roughness Ra is preferably from 0.15 μm to 4.5 μm, more preferably from 0.2 μm to 4 μm, still more preferably from 0.22 μm to 3.5 μm. When a separator having a surface having an arithmetic average surface roughness Ra falling within such range is adopted, the adsorption temporary fixing sheet to be obtained by the production method of the present invention can have a more sufficient shear adhesive strength in a direction parallel to the surface, and can have a weaker adhesive strength in a direction vertical to the surface.

In the method of producing an adsorption temporary fixing sheet of the present invention, at least one kind of the separator(s) to be peeled after the thermal curing is a separator having a surface having an arithmetic average surface roughness Ra of from 0.1 μm to 5 μm, and hence the arithmetic average surface roughness Ra of the surface of the adsorption temporary fixing sheet of the present invention to be obtained after the peeling becomes preferably from 0.1 μm to 10 μm, more preferably from 0.2 μm to 9 μm, still more preferably from 0.3 μm to 8.5 μm, particularly preferably from 0.4 μm to 8 μm. When the surface of the adsorption temporary fixing sheet of the present invention to be obtained after the peeling as described above has an arithmetic average surface roughness Ra falling within such range, the adsorption temporary fixing sheet to be obtained by the production method of the present invention can have a more sufficient shear adhesive strength in a direction parallel to the surface, and can have a weaker adhesive strength in a direction vertical to the surface.

Examples of the separator having a surface having an arithmetic average surface roughness Ra of from 0.1 μm to 5 μm include paper, a plastic film, a polytetrafluoroethylene (PTFE) film, and a plastic film having a surface subjected to silicone treatment or fluorinated silicone treatment. Examples of the plastic film include a polyethylene film, a polypropylene film, a polybutene film, a polybutadiene film, a polymethylpentene film, a polyvinyl chloride film, a vinyl chloride copolymer film, a polyethylene terephthalate film, a polybutylene terephthalate film, a polyethylene naphthalate film, a polyurethane film, an ethylene-vinyl acetate copolymer film, a polyimide film, a polyamide (nylon) film, and an aromatic polyamide (aramid) film. In particular, a plastic film not subjected to surface treatment, such as silicone treatment or fluorinated silicone treatment, is preferred from the viewpoint that the effects of the present invention can be further exhibited. Such separator is particularly preferably a polyethylene terephthalate (PET) film not subjected to surface treatment, such as silicone treatment or fluorinated silicone treatment.

The separator A and the separator B each have a thickness of preferably from 1 μm to 500 μm, more preferably from 3 μm to 450 μm, still more preferably from 5 μm to 400 μm, particularly preferably from 10 μm to 300 μm.

A case in which the foam layer is a silicone foam layer is described as an example of the method of producing an adsorption temporary fixing sheet of the present invention. In the case where the foam layer is any other foam layer, the following description of the production method only needs to be read, for example, while the silicone resin composition is replaced with a composition serving as a raw material for the other foam layer. The adsorption temporary fixing sheet to be produced in the case where the foam layer is the silicone foam layer is sometimes referred to as "silicone foam sheet."

A method of producing a silicone foam sheet according to one embodiment includes: applying a silicone resin composition containing at least a thermosetting silicone resin and water onto a separator A (the step is hereinafter referred to as "step (1)"); mounting a separator B on the surface of the applied silicone resin composition opposite to the separator A (the step is hereinafter referred to as "step (2)"); thermally curing the silicone resin composition (the step is hereinafter referred to as "step (3)"); and peeling at least one kind selected from the separator A and the separator B, followed by heat drying (the step is hereinafter referred to as "step (4)") to form the silicone foam sheet. In this case, at least one kind of the peeled separator(s) is a separator having a surface having an arithmetic average surface roughness Ra of from 0.1 μm to 5 μm.

A method of producing a silicone foam sheet according to another embodiment includes: applying a silicone resin composition containing at least a thermosetting silicone resin and water onto a separator A (the step is hereinafter referred to as "step (1)"); mounting a separator B on the surface of the applied silicone resin composition opposite to the separator A (the step is hereinafter referred to as "step (2)"); thermally curing the silicone resin composition (the step is hereinafter referred to as "step (3)"); peeling at least one kind selected from the separator A and the separator B, followed by heat drying (the step is hereinafter referred to as "step (4)"); and bonding the resultant to the support (the step is hereinafter referred to as "step (5)") to form the silicone foam sheet. In this case, at least one kind of the peeled separator(s) is a separator having a surface having an arithmetic average surface roughness Ra of from 0.1 μm to 5 μm. Then, the above-mentioned support is arranged on a surface side opposite to the surface side of the thermally cured and heat-dried silicone resin composition from which the separator having a surface having an arithmetic average surface roughness Ra of from 0.1 μm to 5 μm has been peeled.

When the separator A or the separator B is directly used as the support, in order that its anchoring property with the foam layer may be improved, it is preferred that an undercoating agent, such as a silane coupling agent, be applied to the surface of the separator A or the separator B serving as the support, or the surface be subjected to surface treatment, such as corona treatment or plasma treatment.

When a separator except the separator having a surface having an arithmetic average surface roughness Ra of from 0.1 μm to 5 μm is used as the separator A or the separator B, for example, a plastic, metal, or glass sheet or film having no air permeability is preferred as such separator. As a material for such sheet or film, there are given, for example: olefin-based resins each containing an α-olefin as a monomer component, such as polyethylene (PE), polypropylene (PP), and an ethylene-vinyl acetate copolymer (EVA); polyester-based resins, such as polyethylene terephthalate (PET), polyethylene naphthalate (PEN), and polybutylene terephthalate (PBT); polyvinyl chloride (PVC); vinyl acetate-based resins; polyphenylene sulfide (PPS); amide-based resins, such as polyamide (nylon) and a wholly aromatic polyamide (aramid); polyimide-based resins; polyether ether ketone (PEEK); copper; aluminum; and any appropriate glass. There is also given, for example, a release liner obtained by subjecting the surface of a base material (liner base material), such as a polytetrafluoroethylene (PTFE) film, paper, or a plastic film, to silicone treatment or fluorinated silicone treatment. Examples of the plastic film serving as the liner base material include a polyethylene film, a polypropylene film, a polybutene film, a polybutadiene film, a polymethylpentene film, a polyvinyl chloride film, a vinyl chloride copolymer film, a polyethylene terephthalate film, a polybutylene terephthalate film, a polyethylene naphthalate film, a polyurethane film, an ethylene-vinyl acetate copolymer film, a polyimide film, a polyamide (nylon) film, and an aromatic polyamide (aramid) film.

In the case where there is a separator that is not removed at the time of the heat drying in the step (4), a release liner that may be used as the separator is preferably the release liner obtained by subjecting the surface of the base material (liner base material), such as the polytetrafluoroethylene (PTFE) film, the paper, or the plastic film, to the fluorinated silicone treatment. In the case where there is a separator that is not removed at the time of the heat drying in the step (4), when the release liner obtained by subjecting the surface of the base material (liner base material), such as the polytetrafluoroethylene (PTFE) film, the paper, or the plastic film, to the fluorinated silicone treatment is used as the separator, its peeling after the heat drying can be easily performed. In addition, the above-mentioned pressure-sensitive adhesive layer may be arranged on the separator A or the separator B.

The separator A to be used in the step (1) and the separator B to be used in the step (2) may be identical to each other, or may be different from each other. In addition, each of the separator A to be used in the step (1) and the separator B to be used in the step (2) may be formed only of one layer, or may be formed of two or more layers.

In accordance with the degree of hydrophilicity or hydrophobicity of the surface of each of the separator A to be used in the step (1) and the separator B to be used in the step (2) in contact with the silicone resin composition, the shape of the surface of the silicone resin composition in contact with the surface changes. For example, when a separator having high hydrophilicity, such as a polyethylene terephthalate (PET) film, is used as the separator A or the separator B, many surface opening portions each having a fine diameter can be caused to be present in the surface of the silicone resin composition in contact with the separator. In addition, for example, when a separator having high hydrophobicity, such as a polyethylene terephthalate (PET) release liner subjected to fluorinated silicone treatment, is used as the separator A or the separator B, a small number of surface opening portions each having a fine diameter can be caused to be present in the surface of the silicone resin composition in contact with the separator. Therefore, when the silicone foam sheet is to be caused to exhibit high air permeability or high adsorptivity, a separator having high hydrophilicity is preferably used, and when the silicone foam sheet is to be caused to exhibit high cut-off performance or high dust resistance, a separator having high hydrophobicity is preferably used. In addition, when repeelability between the silicone foam sheet and a separator is required, a separator having high hydrophobicity is preferably used. The degree of hydrophilicity or hydrophobicity may be defined by, for example, a contact angle with water. For example, when the contact angle with water is less than 900, a separator may be defined as being hydrophilic, and when the contact angle with water is 90° or more, the separator may be defined as being hydrophobic.

In the step (3), the silicone resin composition is thermally cured. The temperature of the heat curing is preferably 50° C. or more and less than 100° C. from the viewpoint that the silicone resin composition can be thermally cured with efficiency. When the temperature of the heat curing is less than 50° C., it may take too long time to perform the heat curing. When the temperature of the heat curing is 100° C. or more, moisture in the silicone resin composition sandwiched between the separator A and the separator B to be brought into a substantially closed state may volatilize to cause the coarsening of cells to be formed or an increase in density thereof. A product formed from the silicone resin composition through the step (3) is referred to as "silicone foam sheet precursor."

When a special heat curing method in which the silicone resin composition is thermally cured while being sandwiched between the separator A and the separator B to be brought into a substantially closed state like the step (3) is performed, the silicone resin composition is thermally cured under a state in which the moisture therein is not removed, and in cooperation with the subsequent step (4), the silicone foam sheet having an open-cell structure and fine cell diameters can be effectively obtained.

In the step (4), the silicone foam sheet precursor from which at least one kind selected from the separator A and the separator B has been peeled is heat-dried. The peeling of at least one kind selected from the separator A and the separator B releases the substantially closed state in the step (3), and the heat drying in the released state efficiently volatilizes and removes the moisture from the silicone foam sheet precursor formed in the step (3) to provide the silicone foam sheet. A heat drying temperature in the step (4) is preferably from 120° C. to 250° C. from the viewpoint that the silicone foam sheet can be effectively formed. When the heat drying temperature in the step (4) is less than 120° C., it may take too long time to perform the drying and the curing, and the silicone foam sheet having an open-cell structure and fine cell diameters may not be obtained. When the heat drying temperature in the step (4) is more than 250° C., it may become difficult to form the sheet owing to the shrinkage or expansion of a base material.

In the step (5), after the step (4), the resultant is bonded to the support to form the silicone foam sheet.

EXAMPLES

Now, the present invention is described specifically by way of Examples. However, the present invention is by no means limited to Examples. Test and evaluation methods in Examples and the like are as described below. The term "part(s)" in the following description means "part(s) by mass" unless otherwise specified, and the term "%" in the following description means "mass %" unless otherwise specified.

<Measurement of Thickness>

An object to be measured (e.g., adsorption temporary fixing sheet) was placed on a glass sheet (Micro Slide Glass S, manufactured by Matsunami Glass Ind., Ltd.) in a 3D measurement laser microscope (LEXT OLS4000, manufactured by Olympus Corporation) under the setting of high accuracy and an objective lens magnification of 10. A 3D image from the surface of the glass sheet to the uppermost part of the object to be measured was measured, and the resultant height was used as the thickness of the object to be measured.

<Measurement of Apparent Density>

An object to be measured (e.g., adsorption temporary fixing sheet) was punched with a punching blade die measuring 50 mm by 50 mm. A thickness value obtained in the <Measurement of Thickness> section was used as the thickness of the object to be measured. The volume of the object to be measured was calculated from those values.

Next, the mass of the object to be measured was measured with an even balance having a minimum scale of 0.01 g or more. The apparent density (g/cm$^3$) of the object to be measured was calculated from those values.

<Measurement of Arithmetic Average Surface Roughness Ra>

A 3D image of an object was captured with a 3D measurement laser microscope (LEXT OLS4000, manufactured by Olympus Corporation) under the setting of high accuracy and an objective lens magnification of 10, and the arithmetic average surface roughness Ra thereof was determined in conformity with JIS B0601 (1994).

<Measurement of Silicon Chip Vertical Adhesive Strength>

A surface opposite to the evaluation surface of a silicone foam sheet was fixed onto a smooth stainless-steel plate with a silicone pressure-sensitive adhesive tape. A 2-kilogram roller was reciprocated once to bond the ground surface of a silicon chip having a thickness of 300 µm, which was obtained by grinding a silicon wafer with a grinder (manufactured by DISCO Corporation, DFG8560) and singulating the silicon wafer into a 1 cm☐ with a dicing saw (manufactured by DISCO Corporation, DFD6450), to the silicone foam sheet, and the resultant was aged at each of −40° C., 23° C., and 125° C. for 20 hours, and was left at rest at 23° C. for 2 hours. The mirror surface (surface opposite to the ground surface) of the silicon chip was compressed with Servopulser (manufactured by Shimadzu Corporation, Controller 4890, Load Cell MMT-250N) under a state in which a double-sided tape (manufactured by Nitto Denko Corporation, No. 5000NS) was bonded to the tip of an adapter of 20 mmΦ at a compression rate of 0.01 N/sec in a vertical direction until a load of 0.05 N was applied thereto, followed by the peeling of the silicon chip at 10 mm/sec. The maximum load at the time of the peeling was defined as a vertical adhesive strength.

<Measurement of Silicon Chip Shearing Adhesive Strength>

A surface opposite to the evaluation surface of a silicone foam sheet was fixed onto a smooth stainless-steel plate with a silicone pressure-sensitive adhesive tape. A 2-kilogram roller was reciprocated once to bond the ground surface of a silicon chip having a thickness of 300 µm, which was obtained by grinding a silicon wafer with a grinder (manufactured by DISCO Corporation, DFG8560) and singulating the silicon wafer into a 1 cm☐ with a dicing saw (manufactured by DISCO Corporation, DFD6450), to the silicone foam sheet, and the resultant was aged at each of −40° C., 23° C., and 125° C. for 20 hours, and was left at rest at 23° C. for 2 hours. A side surface of the silicon chip was pressed with a force gauge (manufactured by Nidec-Shimpo Corporation, FGPX-10) at a rate of 1 mm/sec, followed by the determination of a shear adhesive strength.

Example 1

83.45 Parts by mass of dimethylpolysiloxane having a vinyl group content of 0.28 mass %, 6.40 parts by mass of methylhydrogenpolysiloxane having a silicon atom-bonded hydrogen atom content of 0.7 mass % (the amount of the methylhydrogenpolysiloxane was such that the number of moles of silicon atom-bonded hydrogen atoms in the methylhydrogenpolysiloxane was 5 mol with respect to 1 mol of vinyl groups in the dimethylpolysiloxane), 1.58 parts by mass of smectite clay (aqueous additive, purified bentonite composited with an organic polymer, manufactured by Hojun Co., Ltd.), 184.16 parts by mass of ion-exchanged water, 6.50 parts by mass of fumed silica having a BET specific surface area of 225 m$^2$/g, the fumed silica having been subjected to surface treatment with hexamethyldisilazane, 2.40 parts by mass of red oxide (product name: BAYFERROX, manufactured by Bayer AG), 0.98 part by mass of a nonionic surfactant (sorbitan fatty acid ester, product name: RHEODOL SP-010V, manufactured by Kao-Corporation, HLB: 4.3), 0.045 part by mass of a nonionic surfactant (sorbitan fatty acid ester, product name: RHEODOL SP-030V, manufactured by Kao Corporation, HLB: 1.8), 0.02 part by mass of 1-ethynyl-1-cyclohexanol, and 0.22 part by mass of a solution of a 1,3-divinyltetramethyldisiloxane complex of platinum in 1,3-divinyltetramethyldisiloxane (platinum metal content: about 4,000 ppm) were emulsified with AWATORI RENTARO (manufactured by Thinky Corporation) for 15 minutes. Next, the emulsified liquid was dried under reduced pressure at room temperature for 5 minutes to be defoamed to provide a resin composition (1).

The resin composition (1) was applied onto a fluorosilicone-treated PET film (NIPPA SHEET PET38×1-SS4A, manufactured by Nippa) with an applicator, and a PET film (Lumirror S10, manufactured by Toray Industries, Inc., arithmetic average surface roughness Ra=0.28 µm) was mounted from above the composition, followed by heating with a hot-air oven at 85° C. for 6 minutes to cure the resin composition (1). After the curing, the PET film on one side was peeled, and heat drying was performed at 200° C. for 3 minutes to provide a silicone foam sheet (1) having a thickness of 200 µm, an apparent density of 0.75 g/cm³, and an arithmetic average surface roughness Ra of its surface on the side from which the PET film had been peeled of 6.68 µm.

The results of various measurements of the resultant silicone foam sheet (1) and the results of the evaluations thereof are shown in Table 1.

Example 2

83.45 Parts by mass of dimethylpolysiloxane having a vinyl group content of 0.28 mass %, 6.40 parts by mass of methylhydrogenpolysiloxane having a silicon atom-bonded hydrogen atom content of 0.7 mass % (the amount of the methylhydrogenpolysiloxane was such that the number of moles of silicon atom-bonded hydrogen atoms in the methylhydrogenpolysiloxane was 5 mol with respect to 1 mol of vinyl groups in the dimethylpolysiloxane), 0.57 part by mass of smectite clay (aqueous additive, purified bentonite composited with an organic polymer, manufactured by Hojun Co., Ltd.), 66.11 parts by mass of ion-exchanged water, 6.50 parts by mass of fumed silica having a BET specific surface area of 225 m²/g, the fumed silica having been subjected to surface treatment with hexamethyldisilazane, 2.40 parts by mass of red oxide (product name: BAYFERROX, manufactured by Bayer AG), 0.98 part by mass of a nonionic surfactant (sorbitan fatty acid ester, product name: RHEODOL SP-O10V, manufactured by KaoCorporation, HLB: 4.3), 0.045 part by mass of a nonionic surfactant (sorbitan fatty acid ester, product name: RHEODOL SP-030V, manufactured by Kao Corporation, HLB: 1.8), 0.02 part by mass of 1-ethynyl-1-cyclohexanol, and 0.22 part by mass of a solution of a 1,3-divinyltetramethyldisiloxane complex of platinum in 1,3-divinyltetramethyldisiloxane (platinum metal content: about 4,000 ppm) were emulsified with AWATORI RENTARO (manufactured by Thinky Corporation) for 15 minutes. Next, the emulsified liquid was dried under reduced pressure at room temperature for 5 minutes to be defoamed to provide a resin composition (2).

The resin composition (2) was applied onto a fluorosilicone-treated PET film (NIPPA SHEET PET38×1-SS4A, manufactured by Nippa) with an applicator, and a PET film (Lumirror S10, manufactured by Toray Industries, Inc., arithmetic average surface roughness Ra=0.28 µm) was mounted from above the composition, followed by heating with a hot-air oven at 85° C. for 6 minutes to cure the resin composition (2). After the curing, the PET film on one side was peeled, and heat drying was performed at 200° C. for 3 minutes to provide a silicone foam sheet (2) having a thickness of 200 µm, an apparent density of 0.63 g/cm³, and an arithmetic average surface roughness Ra of its surface on the side from which the PET film had been peeled of 3.03 µm.

The results of various measurements of the resultant silicone foam sheet (2) and the results of the evaluations thereof are shown in Table 1.

Example 3

83.45 Parts by mass of dimethylpolysiloxane having a vinyl group content of 0.28 mass %, 6.40 parts by mass of methylhydrogenpolysiloxane having a silicon atom-bonded hydrogen atom content of 0.7 mass % (the amount of the methylhydrogenpolysiloxane was such that the number of moles of silicon atom-bonded hydrogen atoms in the methylhydrogenpolysiloxane was 5 mol with respect to 1 mol of vinyl groups in the dimethylpolysiloxane), 0.57 part by mass of smectite clay (aqueous additive, purified bentonite composited with an organic polymer, manufactured by Hojun Co., Ltd.), 66.11 parts by mass of ion-exchanged water, 6.50 parts by mass of fumed silica having a BET specific surface area of 225 m²/g, the fumed silica having been subjected to surface treatment with hexamethyldisilazane, 2.40 parts by mass of red oxide (product name: BAYFERROX, manufactured by Bayer AG), 0.98 part by mass of a nonionic surfactant (sorbitan fatty acid ester, product name: RHEODOL SP-O10V, manufactured by KaoCorporation, HLB: 4.3), 0.045 part by mass of a nonionic surfactant (sorbitan fatty acid ester, product name: RHEODOL SP-030V, manufactured by Kao Corporation, HLB: 1.8), 0.02 part by mass of 1-ethynyl-1-cyclohexanol, and 0.22 part by mass of a solution of a 1,3-divinyltetramethyldisiloxane complex of platinum in 1,3-divinyltetramethyldisiloxane (platinum metal content: about 4,000 ppm) were emulsified with AWATORI RENTARO (manufactured by Thinky Corporation) for 15 minutes. Next, the emulsified liquid was dried under reduced pressure at room temperature for 5 minutes to be defoamed to provide a resin composition (3).

The resin composition (3) was applied onto a fluorosilicone-treated PET film (NIPPA SHEET PET38×1-SS4A, manufactured by Nippa) with an applicator, and a PET film (Lumirror QV15, manufactured by Toray Industries, Inc., arithmetic average surface roughness Ra=2.44 µm) was mounted from above the composition, followed by heating with a hot-air oven at 85° C. for 6 minutes to cure the resin composition (3). After the curing, the PET film on one side was peeled, and heat drying was performed at 200° C. for 3 minutes to provide a silicone foam sheet (3) having a thickness of 200 µm, an apparent density of 0.65 g/cm³, and an arithmetic average surface roughness Ra of its surface on the side from which the PET film had been peeled of 4.90 µm.

The results of various measurements of the resultant silicone foam sheet (3) and the results of the evaluations thereof are shown in Table 1.

Example 4

83.45 Parts by mass of dimethylpolysiloxane having a vinyl group content of 0.28 mass %, 6.40 parts by mass of methylhydrogenpolysiloxane having a silicon atom-bonded hydrogen atom content of 0.7 mass % (the amount of the methylhydrogenpolysiloxane was such that the number of moles of silicon atom-bonded hydrogen atoms in the methylhydrogenpolysiloxane was 5 mol with respect to 1 mol of vinyl groups in the dimethylpolysiloxane), 0.85 part by mass of smectite clay (aqueous additive, purified bentonite composited with an organic polymer, manufactured by Hojun Co., Ltd.), 99.16 parts by mass of ion-exchanged water, 6.50 parts by mass of fumed silica having a BET specific surface area of 225 m²/g, the fumed silica having been subjected to surface treatment with hexamethyldisilazane, 2.40 parts by mass of red oxide (product name: BAYFERROX, manufactured by Bayer AG), 0.98 part by mass of a nonionic surfactant (sorbitan fatty acid ester, product name: RHEODOL SP-O10V, manufactured by KaoCorporation, HLB: 4.3), 0.045 part by mass of a nonionic surfactant (sorbitan fatty acid ester, product name: RHEODOL SP-030V, manufactured by Kao Corporation, HLB: 1.8), 0.02 part by mass of 1-ethynyl-1-cyclohexanol, and 0.22 part by mass of a solution of a 1,3-divinyltetramethyldisiloxane complex of platinum in 1,3-divinyltetramethyldisiloxane (platinum metal content: about 4,000 ppm) were emulsified with AWATORI RENTARO (manufactured by Thinky Corporation) for 15 minutes. Next, the emulsified liquid was dried under reduced pressure at room temperature for 5 minutes to be defoamed to provide a resin composition (4).

The resin composition (4) was applied onto a fluorosilicone-treated PET film (NIPPA SHEET PET38×1-SS4A, manufactured by Nippa) with an applicator, and a PET film (Lumirror QV15, manufactured by Toray Industries, Inc., arithmetic average surface roughness Ra=2.44 μm) was mounted from above the composition, followed by heating with a hot-air oven at 85° C. for 6 minutes to cure the resin composition (4). After the curing, the PET film on one side was peeled, and heat drying was performed at 200° C. for 3 minutes to provide a silicone foam sheet (4) having a thickness of 200 μm, an apparent density of 0.48 g/cm$^3$, and an arithmetic average surface roughness Ra of its surface on the side from which the PET film had been peeled of 3.46 μm.

The results of various measurements of the resultant silicone foam sheet (4) and the results of the evaluations thereof are shown in Table 1.

Comparative Example 1

100 Parts by mass of a silicone (SE1700, manufactured by Dow Corning Toray Co., Ltd.) main agent, 10 parts by mass of a catalyst, and 52.8 parts by mass of ethyl acetate were mixed, and the mixture was stirred for 10 minutes. The liquid was applied onto a fluorosilicone-treated PET film (NIPPA SHEET PET38×1-SS4A, manufactured by Nippa) with an applicator, and a PET film (Lumirror S10, manufactured by Toray Industries, Inc., arithmetic average surface roughness Ra=0.28 μm) was mounted from above the composition, followed by heating with a hot-air oven at 85° C. for 6 minutes to cure the silicone. After the curing, the PET film on one side was peeled, and heating was performed at 180° C. for 5 minutes to provide a silicone sheet (C1) having a thickness of 200 μm, an apparent density of 1.14 g/cm$^3$, and an arithmetic average surface roughness Ra of its surface on the side from which the PET film had been peeled of 0.46 μm.

The results of various measurements of the resultant silicone sheet (C1) and the results of the evaluations thereof are shown in Table 1.

INDUSTRIAL APPLICABILITY

The adsorption temporary fixing sheet of the present invention can be utilized as temporary fixing materials in various fields.

The invention claimed is:
1. An adsorption temporary fixing sheet, comprising:
a silicone foam layer including an open-cell structure,
wherein the silicone foam layer has an arithmetic average surface roughness Ra of from 1 μm to 10 μm,
wherein, when a silicon chip vertical adhesive strength of a surface of the foam layer after 20 hours at −40° C. is represented by V1 (N/1 cm□), a silicon chip vertical adhesive strength thereof after 20 hours at 23° C. is represented by V2 (N/1 cm□), and a silicon chip vertical adhesive strength thereof after 20 hours at 125° C. is represented by V3 (N/1 cm□), and
a silicon chip shearing adhesive strength of the surface of the foam layer after 20 hours at −40° C. is represented by H1 (N/1 cm□), a silicon chip shearing adhesive strength thereof after 20 hours at 23° C. is represented by H2 (N/1 cm□), and a silicon chip shearing adhesive strength thereof after 20 hours at 125° C. is represented by H3 (N/1 cm□),
relationships of V1<H1, V2<H2, and V3<H3 are satisfied
where the silicon chip vertical adhesive strength is defined as follows: a surface opposite to an evaluation surface of the adsorption temporary fixing sheet is fixed onto a smooth stainless-steel plate with a silicone pressure-sensitive adhesive tape; a 2-kilogram roller is reciprocated once to bond a ground surface of a silicon chip having a thickness of 300 μm, which is obtained by grinding a silicon wafer with a grinder and singulating the silicon wafer into a 1 cm□ with a dicing saw, to the adsorption temporary fixing sheet, and the resultant is aged at each of −40° C., 23° C., and 125° C. for 20 hours, and is left at rest at 23° C. for 2 hours; a mirror surface opposite to the ground surface of the silicon chip is compressed under a state in which a double-sided tape is bonded to a tip of an adapter of 20 mmΦ at a compression rate of 0.01 N/sec in a vertical direction until a load of 0.05 N is applied thereto, followed by peeling of the silicon chip at 10 mm/sec; and a maximum load at a time of the peeling is defined as the silicon chip vertical adhesive strength, and

TABLE 1

| | | Example 1 | Example 2 | Example 3 | Example 4 | Comparative Example 1 |
|---|---|---|---|---|---|---|
| Sheet thickness (μm) | | 200 | 200 | 200 | 200 | 200 |
| Apparent density (g/cm$^3$) | | 0.75 | 0.63 | 0.65 | 0.48 | 1.14 |
| PET kind | | S10 | S10 | QV15 | QV15 | S10 |
| Arithmetic average surface roughness Ra of PET (μm) | | 0.28 | 0.28 | 2.44 | 2.44 | 0.28 |
| Arithmetic average surface roughness Ra of sheet (μm) | | 6.68 | 3.03 | 4.90 | 3.46 | 0.46 |
| Silicon chip vertical adhesive strength (N/1 cm□) | −40° C./20 hr | 0.7 | 1.9 | 1.0 | 3.1 | 6.0 |
| | 23° C./20 hr | 0.7 | 3.1 | 2.6 | 3.8 | 7.0 |
| | 125° C./20 hr | 0.8 | 7.8 | 1.8 | 7.8 | — |
| Silicon chip shearing adhesive strength (N/1 cm□) | −40° C./20 hr | 2.4 | 7.9 | 5.0 | 8.9 | 18.0 |
| | 23° C./20 hr | 1.3 | 7.0 | 5.0 | 10.0 | 13.4 |
| | 125° C./20 hr | 2.1 | 22.0 | 12.5 | 26.1 | 16.6 | the silicon chip shearing adhesive strength is a shear adhesive strength measured as follows: the surface opposite to the evaluation surface of the adsorption temporary fixing sheet is fixed onto a smooth stainless-steel plate with a silicone pressure-sensitive adhesive tape; a 2-kilogram roller is reciprocated once to bond a ground surface of a silicon chip having a thickness of 300 μm, which is obtained by grinding a silicon wafer with a grinder and singulating the silicon wafer into a 1 cm□ with a dicing saw, to the adsorption temporary fixing sheet, and the resultant is aged at each of −40° C., 23° C., and 125° C. for 20 hours, and is left at rest at 23° C. for 2 hours; and a side surface of the silicon chip is pressed with a force gauge at a rate of 1 mm/sec, followed by the measurement of the shear adhesive strength.

2. The adsorption temporary fixing sheet according to claim 1, wherein the V1 is 5 N/1 cm□ or less.

3. The adsorption temporary fixing sheet according to claim 1, wherein the H1 is 0.5 N/1 cm□ or more.

4. The adsorption temporary fixing sheet according to claim 1, wherein the V2 is 6.5 N/1 cm□ or less.

5. The adsorption temporary fixing sheet according to claim 1, wherein the H2 is 0.6 N/1 cm□ or more.

6. The adsorption temporary fixing sheet according to claim 1, wherein the V3 is 10 N/1 cm□ or less.

7. The adsorption temporary fixing sheet according to claim 1, wherein the H3 is 0.7 N/1 cm□ or more.

8. The adsorption temporary fixing sheet according to claim 1, wherein the silicone foam layer has an apparent density of from 0.15 g/cm$^3$ to 0.90 g/cm$^3$.

* * * * *